(12) United States Patent
Takahashi et al.

(10) Patent No.: US 6,576,984 B2
(45) Date of Patent: *Jun. 10, 2003

(54) SEMICONDUCTOR APPARATUS AND ELECTRONIC SYSTEM

(75) Inventors: Hideyuki Takahashi, Kanagawa (JP); Haruhiko Makino, Kanagawa (JP)

(73) Assignee: Sony Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 49 days.

(21) Appl. No.: 09/212,386

(22) Filed: Dec. 16, 1998

(65) Prior Publication Data

US 2002/0003300 A1 Jan. 10, 2002

(30) Foreign Application Priority Data

Dec. 19, 1997 (JP) ................................. 9-350440

(51) Int. Cl.⁷ ............................................. H01L 23/495
(52) U.S. Cl. ..................... 257/668; 257/673; 257/690; 257/701; 257/738
(58) Field of Search ................................. 257/778, 701, 257/678, 653, 697, 668, 691, 787, 737, 673, 690

(56) References Cited

U.S. PATENT DOCUMENTS

| | | | | |
|---|---|---|---|---|
| 4,888,634 A | * | 12/1989 | Lai et al. | 357/72 |
| 5,331,205 A | * | 7/1994 | Primeaux | 257/790 |
| 5,538,771 A | * | 7/1996 | Nakayama et al. | 428/41.3 |
| 5,663,106 A | * | 9/1997 | Karavakis et al. | 29/841 |
| 5,776,796 A | * | 7/1998 | Kistefano et al. | 483/106 |
| 5,821,608 A | * | 10/1998 | Distefano et al. | 257/669 |
| 5,905,303 A | * | 5/1999 | Kata et al. | 257/701 |
| 6,235,839 B1 | * | 5/2001 | Gumtherberg | 525/71 |

* cited by examiner

*Primary Examiner*—Albert W. Paladini
*Assistant Examiner*—Luan Thai
(74) *Attorney, Agent, or Firm*—Sonnenschein, Nath & Rosenthal

(57) ABSTRACT

A semiconductor apparatus includes a semiconductor device and a wiring member having an insulating resin base, wiring layers connected to the individual electrodes of the semiconductor device, and external terminals. The semiconductor device or a reinforcing plate placed around the semiconductor device and the wiring member are bonded to each other with an insulating elastic material therebetween. The insulating elastic material retains rubber elasticity under the environmental conditions of the fabrication process and of use. An electronic system includes a semiconductor apparatus as described above.

4 Claims, 7 Drawing Sheets

FIG. 3
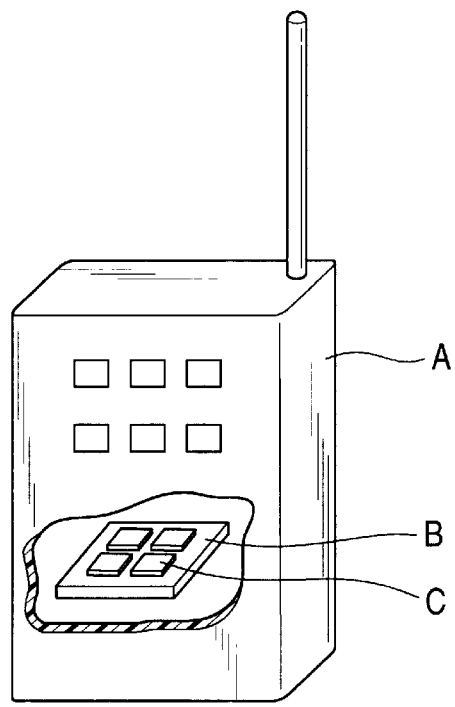
FIG. 4
[MOLECULAR STRUCTURES]
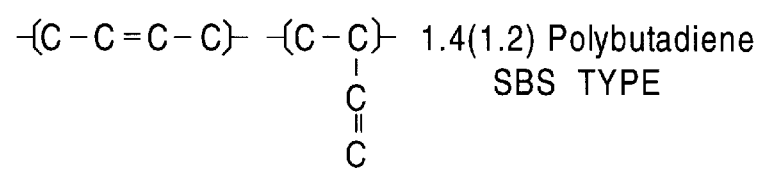
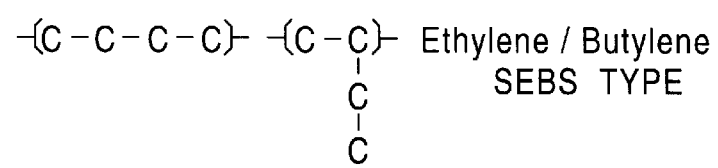

FIG. 5

| SELECTED STRUCTURE | REASON FOR SELECTION |
|---|---|
| MAIN CHAIN : POLYISOBUTYLENE $$(-CH_2-\underset{\underset{CH_3}{\mid}}{\overset{\overset{CH_3}{\mid}}{C}}-)n$$ | • HEAT RESISTANCE, WEATHER RESISTANCE [COMPLETELY SATURATED HYDROCARBON]<br>• LOW Tg [-50°C OR LESS]<br>• LIQUID RESIN AT ROOM TEMPERATURE<br>• ELASTOMERIC AT ROOM TEMPERATURE<br>• LOW MOISTURE PERMEABILITY<br>• HIGH VIBRATION ABSORPTION |
| FUNCTIONAL GROUP : DIMETHOXYSILYL GROUP $$\overset{CH_2}{\underset{-Si(OH_3)_2}{\mid}}$$ | • CURABILITY AT ROOM TEMPERATURE [METHOXY> ETHOXY]<br>• STABILITY AT ROOM TEMPERATURE [MONO> DI> TRI-]<br>• THREE-DIMENSIONAL CROSS-LINK [CHAIN ELONGATION ONLY FOR MONOMETHOXY] |
| ALLYL GROUP $$CH_2CH=CH_2$$ | • HEAT-CURABILITY [PRIMARY> SECONDARY> TERTIARY] |
| POSITION : BOTH ENDS [TELECHELIC] | • INTER-CROSSLINKING MOLECULAR WEIGHT CONTROLLABLE |

FIG. 6
⟨ROOM-TEMPERATURE CURABL: TYPE S⟩
⟨HEAT-CURABLE : TYPE A⟩
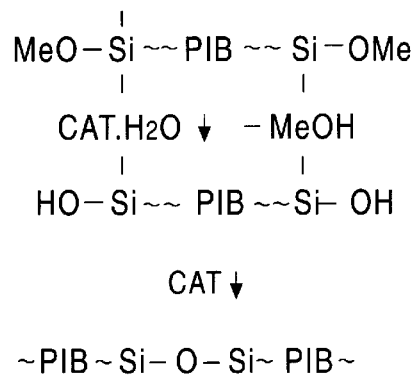
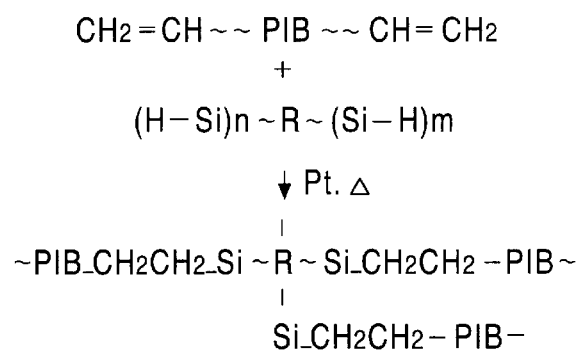
[THREE-DIMENSIONAL CROSS-LINKED POLYMER]
  IN SITU WORKING
  SEVERAL HOURS TO SEVERAL DAYS AT ROOM TEMPERATURE
[THREE-DIMENSIONAL CROSS-LINKED POLYMER]
  LINE PRODUCTION
  SEVERAL MINUTES TO SEVERAL TENS OF MINUTES AT HIGH TEMPERATURE

FIG. 7
⟨ ROOM-TEMPERATURE CURABLE : TYPE S ⟩
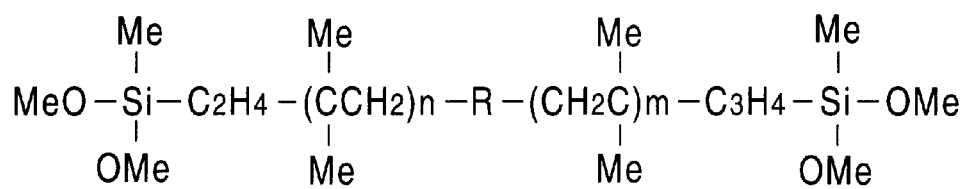
⟨ HEAT-CURABLE : TYPE A ⟩
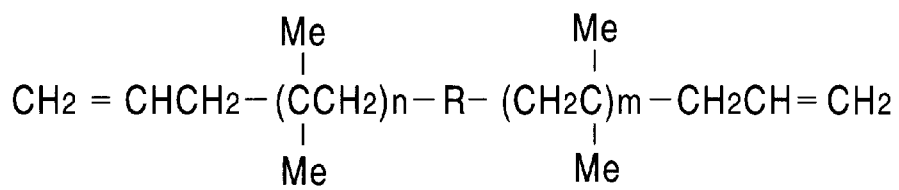
FIG. 8
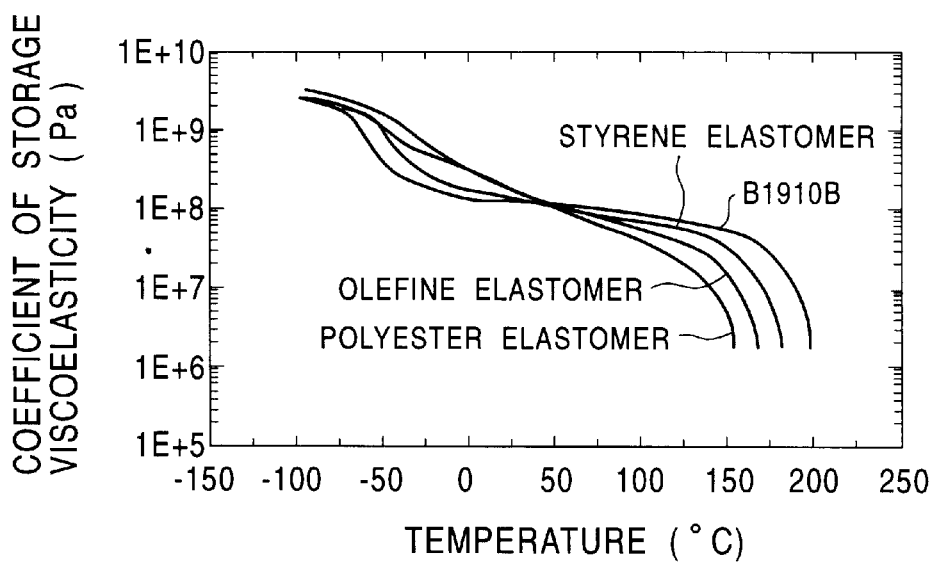

SEMICONDUCTOR APPARATUS AND ELECTRONIC SYSTEM

BACKGROUND OF THE INVENTION

1. Field of the Invention

The present invention relates to a semiconductor apparatus, and in particular, to a semiconductor apparatus in which a semiconductor device and a wiring member having an insulating resin base, wiring layers connected to the individual electrodes of the semiconductor device, and external terminals, are bonded to each other with an insulating elastic material therebetween, and to an electronic system using such a semiconductor apparatus.

2. Description of the Related Art

In a semiconductor apparatus such as an apparatus of a chip size package (CSP) type, each electrode of the semiconductor device is extracted through a wiring member. The wiring member for extracting electrodes includes a base composed of an insulating resin such as polyimide, and wiring layers composed of, for example, copper. One end of each wiring layer is, for example, directly connected to each electrode of the semiconductor device, and the other end is provided with an electrode (e.g., a ball-shaped electrode composed of solder) as an external electrode. The wiring member and the semiconductor device are bonded to each other.

With respect to a semiconductor apparatus in which electrodes of a semiconductor are extracted through the wiring member as described above, Japanese Patent Publication No. 6-504408 discloses that the connection between a wiring member and a semiconductor device is performed by interposing an insulating elastic material. In a semiconductor apparatus, in response to changes in temperature during use, a relative movement occurs between a wiring member and a semiconductor device because of the difference in coefficient of thermal expansion between the two, and the relative movement may exert a force between the individual electrodes of the semiconductor device and the electrodes of the wiring member, resulting in an increase in strain, fracturing of electrodes, and the like.

In accordance with the patent publication described above, the insulating elastic material enables the wiring member to move in relation to the semiconductor device, and the insulating elastic material has an indentation hardness of approximately 20 to 70.

However, the present inventors have found, by testing, that the technique disclosed in the above-mentioned patent publication is not practical. Although in this technique it is generally understood that a material is used which is elastic at temperatures higher than room temperature, rubber elasticity is not always retained under the environmental conditions of the fabrication process and of use by being elastic only at temperatures higher than room temperature, and at low temperatures, for example, at −55° C., the required effect cannot be expected.

Generally, a rubber elastic material has rubber elasticity at temperatures higher than a glass transition temperature, and loses elasticity at temperatures lower than the glass transition temperature because the material is transformed into a glassy state. FIG. 10 is a graph which shows the dependence of the relative Young's modulus and loss modulus on temperature with respect to styrene-butadiene rubber as a general rubber. Specifically, FREQUENCY at an axis of ordinates corresponds to Young's modulus (elastic modulus), and DAMPING at the other axis of ordinates corresponds to loss modulus. In the drawing, the solid line shows a change in Young's modulus by temperature, and the dashed line shows a change in loss modulus by temperature. As shown in the graph, the rubber has a glass transition temperature of −37° C., and at temperatures lower than that, the rubber is transformed into a glassy state and loses rubber elasticity.

Semiconductor apparatuses are required to be operated, generally, at −55° C. to 125° C., or, at a higher level, at −55° C. to 150° C. Therefore, when a general rubber is used as an insulating elastic material between wiring members and semiconductor devices, it loses rubber elasticity at −35° C. or less, and thus the requirement cannot be satisfied. The above-mentioned patent publication does not describe the need for such a requirement to be met, or the specific means to satisfy the requirement.

SUMMARY OF THE INVENTION

Accordingly, the present invention has been made to satisfy the requirement described above. With respect to a semiconductor apparatus in which a semiconductor device and a wiring member having an insulating resin base, wiring layers connected to the individual electrodes of the semiconductor device, and external terminals, are bonded to each other with an insulating elastic material therebetween, it is an object of the present invention to prevent the insulating elastic material from losing rubber elasticity at low temperatures, and thus, to enhance the reliability of the semiconductor apparatus and also the reliability of an electronic system using the semiconductor apparatus.

In one aspect, in accordance with the present invention, a semiconductor apparatus includes an insulating elastic material that retains rubber elasticity under the environmental conditions of the fabrication process and of use.

In the semiconductor apparatus of the present invention, since the insulating elastic material always retains rubber elasticity, the relative movement between the wiring member and the semiconductor device in response to changes in temperature is always allowed. Therefore, an increase in strain or fracturing can be prevented in the semiconductor device, particularly around the electrodes, resulting from the incapability for relative movement between the wiring member and the semiconductor device because of the loss of rubber elasticity by the insulating elastic material, and thus low-temperature resistance and reliability of the semiconductor apparatus can be improved.

Preferably, the insulating elastic material has rubber elasticity at −50 to 120° C.

In another aspect, in accordance with the present invention, an electronic system includes at least a semiconductor apparatus in which a semiconductor device and a wiring member having an insulating resin base, wiring layers connected to the individual electrodes of the semiconductor device, and external terminals, are bonded to each other with an insulating elastic material therebetween, and the insulating elastic material retains rubber elasticity under the environmental conditions of the fabrication process and of use.

Accordingly, in the electronic system of the present invention, since the semiconductor apparatus, in which the insulating elastic material always retains rubber elasticity to allow the relative movement between the wiring member and the semiconductor device in response to changes in temperature, is used, low-temperature resistance and reliability of the electronic system can be improved.

Preferably, the insulating material has rubber elasticity at −50 to 120° C.

BRIEF DESCRIPTION OF THE DRAWINGS

FIG. 3 an isometric partially cut-out view which shows an electronic system (a mobile phone) using the semiconductor apparatus shown in FIG. 1;

FIG. 4 shows the molecular structures of butadiene monomer, adiene of SBS type, and ethylene/butylene of SEBS type;

FIG. 5 shows a chemical structural design of EPION as an example an insulating elastic material;

FIG. 6 shows curing reaction mechanisms of EPION;

FIG. 7 shows chemical structures of commercially available EPION;

FIG. 8 is a graph which shows the dependence of the coefficient of storage viscoelasticity on temperature with respect to EPION, (B1910B) and other elastomers;

DESCRIPTION OF THE PREFERRED EMBODIMENT

In a semiconductor apparatus of the present invention, in which a semiconductor device and a wiring member having an insulating resin base, wiring layers connected to the individual electrodes of the semiconductor device, and external terminals, are bonded to each other with an insulating elastic material therebetween, the insulating elastic material retains rubber elasticity under the environmental conditions of the fabrication process and of use. The present invention is applicable to a semiconductor apparatus in general, in which the individual electrodes of a semiconductor device are extracted through a wiring member by external electrodes, for example, an apparatus of a ball grid array (BGA) type, in addition to an apparatus of a chip size package (CSP) type, and is applicable to the one either having or not having a ring (peripheral ring). Also, the present invention is applicable to any one of an apparatus of a direct bonding type, in which wiring layers of the wiring member and the semiconductor device are directly bonded, and an apparatus of a wire bonding type, in which bonding is performed by wires (bonding wires).

The fabrication process designates a process in which a semiconductor device is mounted with a wiring member and so on, and does not include a process for manufacturing each element of the semiconductor device in a wafer state. The environmental conditions of the fabrication process and of use may differ depending on the types and uses of the semiconductor apparatuses or electronic system using such semiconductor apparatuses. In general, semiconductor apparatuses or electronic systems are used at −55 to 125° C., and some of them are used, for example, at −50 to 120° C. The insulating elastic material in the present invention has rubber elasticity in a temperature range determined by the types and uses. One example of an insulating elastic material is RABALON (trade name; manufactured by Mitsubishi Chemical Corporation), which has a series of product groups such as the S series and M series. This is a thermoplastic elastomer, and uses SEBS (hydrogenated SBS block copolymer) of the Shell Chemical Company, U.S.A. as a base polymer. RABALON is used in a temperature range from −65 to 120° C., has excellent low-temperature resistance, and has more favorable aging characteristics in comparison with vulcanized rubber, and therefore, is significantly suitable for use in the present invention. FIG. 4 shows the molecular structures of butadiene monomer, polybutadiene of SBS type, and ethylene/butylene of SEBS type.

Figure 9:
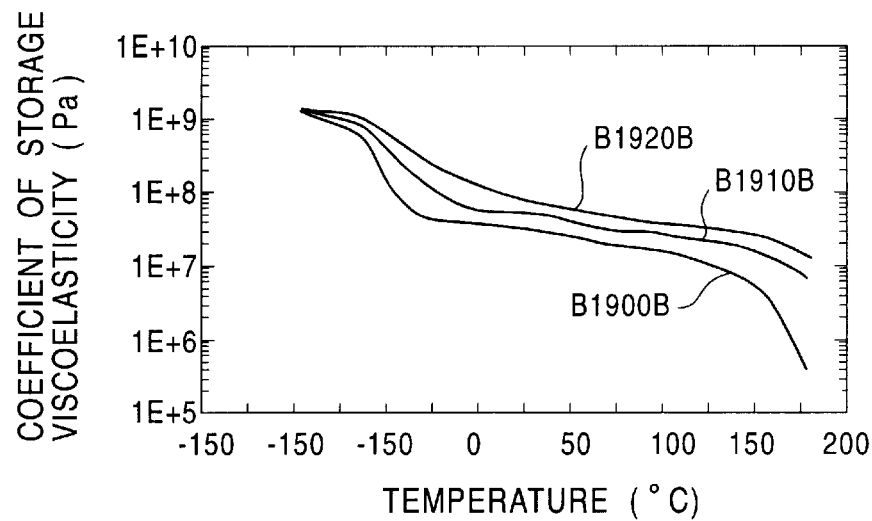
FIG. 9 a graph which shows the dependence of the coefficient of storage viscoelasticity on temperature with respect to three types of the B series of EPION.
Figure 10:
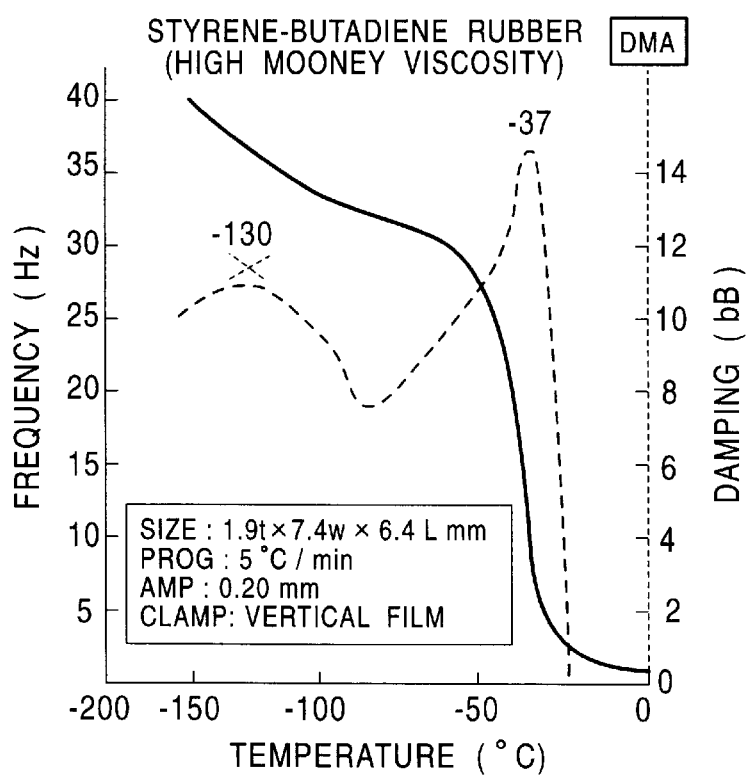
FIG. 10 a graph which shows the dependence of the relative Young's modulus and loss modulus on temperature with respect to styrene-butadiene rubber as a general rubber.

Another example that is suitable for use in the present invention is EPION (trade name; manufactured by Kaneka Corporation). This is a polyisobutylene-based liquid resin, and has a low glass transition temperature Tg of −50° C. or less. FIG. 5 shows a chemical structural design of EPION, FIG. 6 shows curing reaction mechanisms of EPION, FIG. 7 shows chemical structures of commercially available EPION, and FIG. 8 is a graph which shows the dependence of the coefficient of storage viscoelasticity on temperature with respect to EPION (B1910B) and other elastomers. FIG. 9 is a graph which shows the dependence of the coefficient of storage viscoelasticity on temperature with respect to three types of the B series of EPION. Of course, insulating elastic materials other than those described above may be used.

The semiconductor apparatus of the present invention can be used for various types of electronic systems, and, in particular, used well for an electronic system which requires miniaturization such as a mobile phone. Accordingly, by using the semiconductor apparatus of the present invention for an electronic system such as a mobile phone used in a severely cold place, the low-temperature resistance of the electronic system can be improved.

Figure 1:
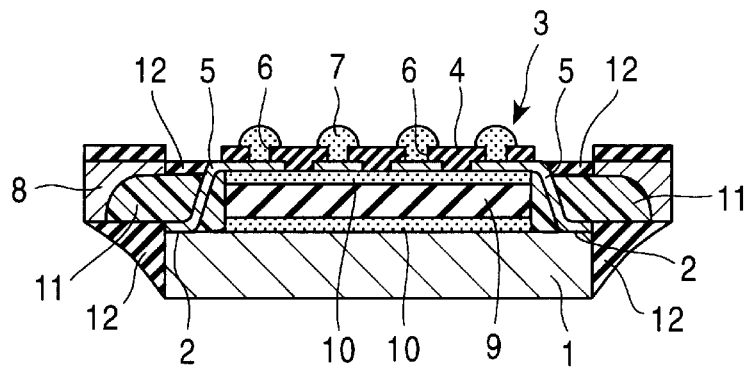
FIG. 1 is a sectional view of a semiconductor apparatus as a firs embodiment of the present invention.

The present invention will be described with reference to the drawings. FIG. 1 shows a semiconductor apparatus as a first embodiment of the present invention. In the drawing, numeral 1 represents a semiconductor device, and numeral 2 represents an electrode placed in the periphery of the semiconductor device 1. Numeral 3 represents a wiring member, for extracting the electrode, which includes a base 4 composed of an insulating resin such as polyimide, a wiring layer 5 composed of, for example, copper, an electrode-formation hole 6 for exposing the wiring layer 5 in the base 4, and a ball electrode 7 composed of, for example, solder, formed on the electrode-formation hole 6. The ball electrode 7 corresponds to an external terminal.

A ring (peripheral ring) 8, which is a component of the wiring member 3, surrounds the section in which the semiconductor device is to be bonded, and is composed of, for example, copper. The ring 8 functions as a reinforcement and as an electrostatic shield by being connected to a ground electrode of a power supply to increase noise resistance.

An insulating elastic material 9 interposes between the semiconductor device 1 and the wiring member 3. Adhesives 10 and 10 bond the insulating elastic material 9 to the semiconductor device 1 and to the wiring member 3, and the semiconductor device 1 and the wiring member 3 are bonded together by the adhesives 10 and 10 with the insulating elastic material 9 therebetween. The adhesive 10 is preferably a rubbery silicone resin, epoxy resin, or the like, and may be another thermoplastic resin having heat resistance. However, it is preferably a material which retains rubber elasticity at a lowest possible temperature. Therefore, for example, heat-curable EPION type A may be used.

An elastomeric adhesive 11 interposes between the ring 8 and the insulating elastic material 9. The elastomeric adhesive 11 is preferably composed of the same material as that of the adhesive 10 or of the same resin line, and desirably has heat resistance, thermoplasticity, and low-temperature resistance. Therefore, although the elastomeric adhesive 11 is preferably a rubbery silicone resin, epoxy resin, or the like, it is not limited to that described above. For example, heat-curable EPION type A may be used.

Adhesives 12 and 12 are placed on upper and lower sides of the elastomeric adhesive 11 to fix the ring 8 to the wiring member 3 and the semiconductor device 1. The adhesives 12 and 12 are formed in order to reinforce the elastomeric adhesive 11 when the intensity of the semiconductor apparatus is concerned, and they are not required when the intensity is not concerned. However, when the adhesive 12 is required, it preferably has a coefficient of linear expansion close to that of the ring 8. Otherwise, the adhesive 12 may have strain by thermal stress, resulting in a decrease in reinforcement.

The insulating elastic material 9 is composed of a material which retains rubber elasticity under the environmental conditions of the fabrication process and of use. As the material, for example, series of RABALON (trade name; manufactured by Mitsubishi Chemical Corporation) such as the S series or M series are preferred. RABALON is a thermoplastic elastomer, and uses SEBS (hydrogenated SBS block copolymer) of the Shell Chemical Company, U.S.A. as a base polymer. The molecular structure of its main component is shown in FIG. 4. RABALON is used in a temperature range from −65 to 120° C., and has excellent low-temperature resistance, and also has more favorable aging characteristics in comparison with vulcanized rubber. Also, EPION (trade name; manufactured by Kaneka Corporation) is preferably used, because it is a polyisobutylene-based liquid resin and has a low glass transition temperature Tg of −50° C. or less. FIG. 5 shows a chemical structural design of EPION, FIG. 6 shows its curing reaction mechanisms, and FIG. 7 shows its commercially available chemical structures. EPION has a coefficient of elasticity which is dependent on temperature as shown in FIGS. 8 and 9.

In accordance with the semiconductor apparatus described above, the insulating elastic material always retains rubber elasticity under the environmental conditions of the fabrication process and of use, and thus relative movements in response to changes in temperature among the ring, the wiring member, the semiconductor device are always allowed. Also, the insulating elastic material surrounded by the ring, the wiring member, and the semiconductor device can be protected by the adhesive having a coefficient of linear expansion close to that of the ring, and thus the reliability of the semiconductor apparatus having the ring can be enhanced.

Figure 2A:
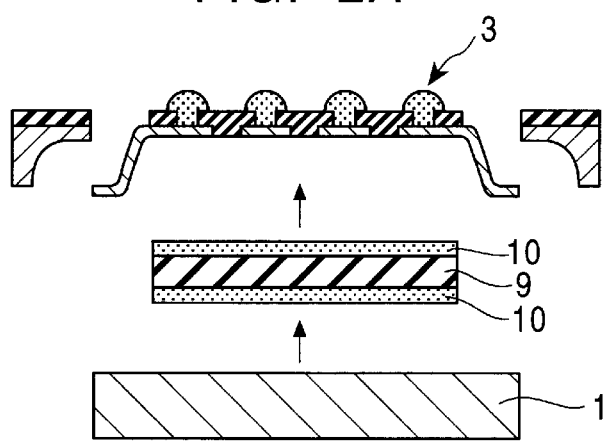
FIGS. 2A and 2B are sectional views which show the steps of fabricating he semiconductor apparatus shown in FIG. 1.
Figure 2B:
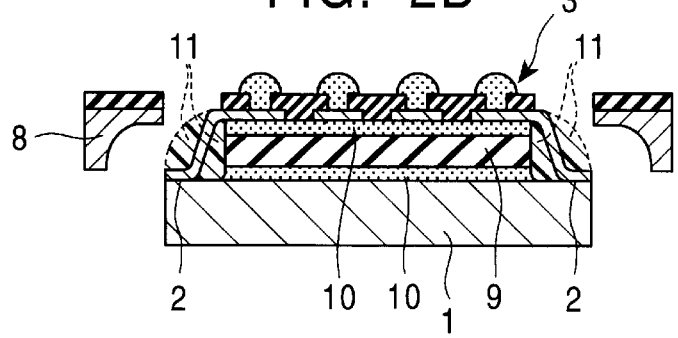

FIGS. 2A and 2B show the steps in a method of fabricating the semiconductor apparatus described above. First, as shown in FIG. 2A, the wiring member 3, the insulating elastic material 9 coated with unreacted adhesives 10 and 10 at both surfaces (alternatively, an unreacted adhesive that is the same as the unreacted adhesives 10 and 10 may be formed as the insulating elastic material 9 in accordance with the present invention), and the semiconductor device 1 are prepared. Next, as shown in FIG. 2B, the wiring member 3 and the semiconductor device 1 are bonded to each surface of the insulating elastic material 9 with the unreacted adhesives 10 and 10 therebetween, and the adhesives 10 and 10 are cured. Then, the individual wiring layers 5 are bonded to the corresponding electrodes 2 of the semiconductor device 1, and the portions lying off the base 4 of the bonded wiring layers 5 are sealed and fixed by the elastomeric adhesive 11 that is analogous to the adhesive 10. FIG. 2B shows a state in which the fixture has been completed.

Then, the insulating elastic material 9 and the ring 8 are sealed by the adhesive 11, and the ring 8, the wiring member 3, and the semiconductor device 1 are sealed at both sides of the adhesive 11.

When the wiring layers 5 are fixed by the adhesive 11 after bonding, the insulating elastic material 9 and the ring 8 may be fixed by the adhesive 11 at the same time. Of course, as described above, after protecting the wiring layers 5 by the adhesive 11 and curing the adhesive 11, an adhesive analogous to the adhesive 11 may be filled into a space between the adhesive 11 and the ring 8 for fixing, and another adhesive that has a stronger reinforcing effect in comparison with the adhesive 11 may be used as the adhesive for fixing in order to increase the reinforcing intensity.

The adhesives 12 and 12 may be formed on both sides of the adhesive 11 between the ring 8 and the insulating elastic material 9, or may not be formed if not required in terms of intensity. When resins of different materials are brought into contact with each other, good adhesion is important in view of moisture resistance. Also, in terms of the stress of the wiring member 3 and the semiconductor device 1, the adhesives 11 and 12 are preferably low-stress materials (having characteristics such as low coefficient of expansion, low Young's modulus, and good low-temperature resistance). That is, preferably, the inner lead, the semiconductor device, and so on are allowed to move relatively in response to changes in temperature of the wiring member during mounting. Therefore, it is preferable that in addition to the insulating elastic material 9, adhesives 10 and 11, and also, the adhesive 12 have rubber elasticity in a wide range from low to high temperatures. Accordingly, for example, the heat-curable EPION type A described above is suitable as the adhesives 10, 11, and so on.

In accordance with such a semiconductor apparatus in which solder ball electrodes 7 are connected to the electrodes of the semiconductor device 1 through the wiring layers 5 of the wiring member 3, since the insulating elastic material 9, and the adhesives 10, 11, and 12 retain rubber elasticity in a wide temperature range, strain caused by the differences in coefficients of linear expansion among each material of the semiconductor apparatus in response to changes in temperature in the assembly process and after mounting (including during use) can be absorbed by the insulating elastic material 9 and the like.

With respect to the wiring layers 5 of the wiring member 3, both of those which are bonded to the electrodes 2 of the semiconductor device 1 and those which are not bonded are sealed and protected by the adhesives 10 and 11 of the same material, and therefore, there will be no stress and subsequent damage which might occur at the interface between the two adhesives when the wiring layers are sealed or protected by adhesives of different materials.

When the same or analogous resins are used for the adhesives 10, 11, and 12, by also using an analogous resin for the insulating elastic material 9, stress caused among them can be minimized.

Since the insulating elastic material 9 is interposed between the wiring member 3 and the semiconductor device 1, and a material always having rubber elasticity under the environmental conditions of the fabrication process and of use is used for the insulating elastic material 9, the semiconductor apparatus can endure a severe reliability test in a temperature range from −65 to 150° C.

Figure 11:
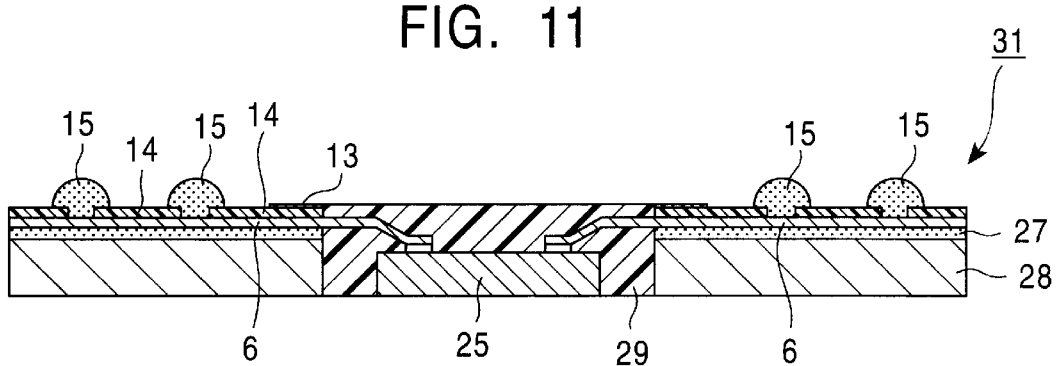
FIG. 11 is a sectional view of a semiconductor apparatus of a ball grid array (BGA) type.

The insulating elastic material in the present invention may be used, for example, as an adhesive between a reinforcing plate and a film circuit in a semiconductor apparatus of a ball grid array (BGA) type as shown in FIG. 11.

One end of a lead 6 formed on a base 14 composed of an insulating resin is connected to a semiconductor chip 25, and the other end of the lead 6 is connected to a ball electrode 15. A film circuit including the base 14, the lead 6, and the ball electrode 15 is bonded to a reinforcing plate 28 with an insulating elastic material 27 therebetween. In such a case, also by using a material having a glass transition temperature Tg of −50° C. or less such as a silicone-based material, a highly reliable semiconductor apparatus can be obtained in which there is no damage or the like to ball electrodes which might be caused by a difference in thermal expansion coefficient between the reinforcing plate and the film circuit under the environmental conditions of the fabrication process and of use.

Figure 12:
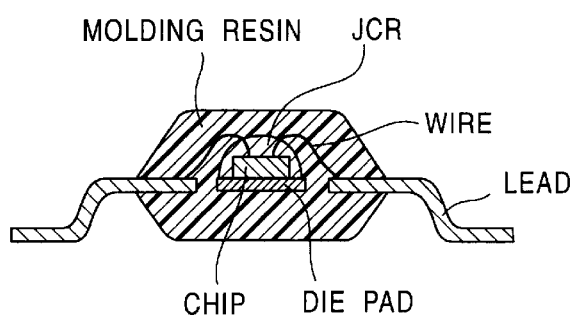
FIG. 12 is a sectional view of a semiconductor apparatus of a quad flat package (QFP) type.

Also, the insulating elastic material in the present invention is applicable to a semiconductor apparatus of a quad flat package (QFP) type as shown in FIG. 12 in which a molding resin is used. As shown in the drawing, electrodes of a semiconductor chip mounted on a die pad by die bonding and leads are connected by bonding wires, and the semiconductor chip along with the electrodes and the connections with the wires is coated with a junction coating resin (JCR). By using an insulating elastic material having a glass transition temperature Tg of −50° C. or less such as a silicone-based material as a JCR, moisture resistance can be secured, and cracks of semiconductor chips or wire disconnection can be prevented.

Figure 13:
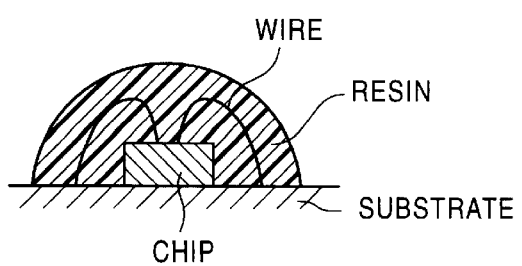
FIG. 13 a sectional view of a semiconductor apparatus of a chip on board (COB) type.

Also, the insulating elastic material in the present invention is applicable to a semiconductor apparatus of a chip on board (COB) type as shown in FIG. 13 in which a bare chip is directly mounted on a substrate. In such a case, resin sealing is also required in order to secure moisture resistance and prevent the disconnection of wire bonding. By using a silicone-based material having a glass transition temperature Tg of −50° C. or less as a resin, a highly reliable semiconductor apparatus can be obtained in which there is no damage to the chip or wire disconnection which might be caused by a difference in thermal expansion coefficient under the environmental conditions of the fabrication process and of use.

FIG. 3 is an isometric partially cut-out view which shows an electronic system (a mobile phone) A using a semiconductor apparatus of the present inventions. A semiconductor apparatus C in accordance with the present invention is mounted on a motherboard B within the electronic system A, and constitutes at least a part of the internal circuit.

In the semiconductor apparatus of the present invention, since the insulating elastic material always retains rubber elasticity, the relative movement between the wiring member and the semiconductor device in response to changes in temperature is always allowed. Therefore, an increase in strain or fracturing can be prevented in the semiconductor device, particularly around the electrodes, resulting from an incapability for relative movement between the wiring member and the semiconductor device because of the loss of rubber elasticity by the insulating elastic material, and thus low-temperature resistance and reliability of the semiconductor apparatus can be improved.

In the semiconductor apparatus of the present invention, since the same adhesive as that for connecting the insulating elastic material to the semiconductor device and the wiring member or an analogous adhesive is used for sealing the connections and their vicinities between the wiring layers and the electrodes of the semiconductor device, there will be no strain between the adhesives. Therefore, the wiring layers are protected without a strain.

In the semiconductor apparatus of the present invention, since an adhesive having a coefficient of linear expansion close to that of the ring is formed on both sides of the adhesive between the ring and the wiring member, the semiconductor apparatus can be further reinforced, and the ring, the wiring member, and the semiconductor device can be protected from thermal stress more completely.

In accordance with the electronic system of the present invention, since a semiconductor apparatus, in which an insulating elastic material retains rubber elasticity under the environmental conditions of the fabrication process and of use to allow the relative movement between the wiring member and the semiconductor device in response to changes in temperature, is used, low-temperature resistance and reliability of the electronic system can be improved.

What is claimed is:

1. A semiconductor apparatus comprising:

a semiconductor device; and a film circuit comprising an insulating resin base, writing layers connected to individual electrodes of said semiconductor device, and external terminals, a reinforcing member being placed around said semiconductor device and said film circuit being bonded to said semiconductor with an insulting elastic material therebetween;

wherein said semiconductor device and said film circuit are connected to said insulating elastic material with an adhesive provided on upper and lower surfaces of said insulating elastic material, and wherein an area between the wiring layers and the electrodes is sealed with another adhesive selected from the same adhesive and an analogous adhesive.

2. The semiconductor apparatus according to claim 1, wherein said insulating elastic material retains rubber elasticity at −50° C. to 120° C. under the environmental conditions of the fabrication process of use.

3. The semiconductor apparatus according to claim 1, wherein said adhesive is a resin having a glass transition temperature of −50° C. or less.

4. A semiconductor apparatus, comprising:

a semiconductor device;

a wiring member comprising an insulating resin base, wiring layers connected to individual electrodes of said semiconductor device, and external terminals; and an insulating elastic material disposed between the semiconductor device and the wiring member so as to bond the semiconductor device to the wiring member, said insulating elastic material retaining rubber elasticity at −50° C. to 120° C. under the environmental conditions of the fabrication process of use, wherein said wiring member is provided with a ring in the periphery, a space between said ring and said wiring member is filled with a first adhesive, and an interface between said ring and the first adhesive and an interface between said wiring member and the first adhesive are interposed by a second adhesive having a coefficient of linear expansion close to that of said ring.

* * * * *